United States Patent
Li et al.

(10) Patent No.: US 6,871,770 B2
(45) Date of Patent: Mar. 29, 2005

(54) ULTRASONIC TRANSDUCER

(75) Inventors: Hing Leung Li, Kowloon (HK); Kelvin Ming Wai Ng, Kowloon (HK); Helen Lai Wa Chan, Kowloon (HK); Peter Chou Kee Liu, Kowloon (HK)

(73) Assignee: ASM Assembly Automation Limited, Kowloon (HK)

( * ) Notice: Subject to any disclaimer, the term of this patent is extended or adjusted under 35 U.S.C. 154(b) by 40 days.

(21) Appl. No.: 10/418,114

(22) Filed: Apr. 18, 2003

(65) Prior Publication Data

US 2004/0035912 A1 Feb. 26, 2004

Related U.S. Application Data

(63) Continuation-in-part of application No. 09/967,222, filed on Oct. 1, 2001, now abandoned.

(51) Int. Cl.[7] .............................. B23K 1/06; B23K 5/20
(52) U.S. Cl. ................. 228/1.1; 228/110.1; 156/580.1; 156/580.2
(58) Field of Search .............................. 228/1.1, 110.1; 156/580.1, 580.2; 310/325

(56) References Cited

U.S. PATENT DOCUMENTS

| | | | |
|---|---|---|---|
| 3,670,944 A | 6/1972 | Dushkes et al. | |
| 4,974,581 A | * 12/1990 | Wiksell | 601/2 |
| 5,263,630 A | 11/1993 | Kanomata et al. | |
| 5,469,011 A | * 11/1995 | Safabakhsh | 310/325 |
| 5,486,733 A | 1/1996 | Yamazaki et al. | |
| 5,578,888 A | 11/1996 | Safabakhsh | |
| 5,603,445 A | * 2/1997 | Hill et al. | 228/4.5 |
| 5,699,953 A | 12/1997 | Safabakhsh | |
| 5,816,476 A | * 10/1998 | Buice et al. | 228/102 |
| 5,884,834 A | 3/1999 | Vinson et al. | |
| 5,890,643 A | * 4/1999 | Razon et al. | 228/1.1 |
| 5,931,367 A | 8/1999 | Sato et al. | 156/580.1 |
| 5,998,908 A | * 12/1999 | Goodson | 310/325 |
| 6,058,823 A | * 5/2000 | Michoud | 83/508.3 |
| 6,190,497 B1 | 2/2001 | Chan et al. | |
| 6,382,494 B1 | 5/2002 | Miller | |

FOREIGN PATENT DOCUMENTS

JP 10-225461 A * 8/1998

* cited by examiner

Primary Examiner—Lynne R. Edmondson
(74) Attorney, Agent, or Firm—Burns, Doane, Swecker & Mathis, L.L.P.

(57) ABSTRACT

A transducer for a wire bonding apparatus is formed of two separate parts sandwiching therebetween a plurality of piezoelectric elements. One of the two parts is the amplifying horn, and by selecting appropriate sizes and shapes for the two parts, vibrational energy can be concentrated at the distal end of the amplifying horn where the bonding tool is located.

16 Claims, 8 Drawing Sheets

ULTRASONIC TRANSDUCER

This application is a Continuation-in-Part of U.S. patent application Ser. No. 09/967,222, filed Oct. 1, 2001, now abandoned, the entire disclosure of which is herein expressly incorporated by reference.

FIELD OF THE INVENTION

This invention relates to an ultrasonic transducer for use in wire bonding applications.

BACKGROUND OF THE INVENTION

In wire bonding operations, for example where it is desired to connect the lead wires from a semiconductor component to bond pads formed on a substrate, an ultrasonic welding operation is carried out using a transducer that is caused to vibrate at ultrasonic frequencies. A conventional transducer comprises a piezoelectric element for generating ultrasonic vibrations, an ultrasonic amplifying horn and a bonding tool which is normally in the form of a capillary or wedge. The bonding tool is located at the free end of the amplifying horn and is used to apply the bonding force to the components being welded together.

The amplifying horn is normally provided with a flange or other form of mounting member, often known as a barrel or collar, that permits the transducer to be mounted to a wire bonding machine for movement in the X, Y and Z axes (and also in some designs about a θ axis) as required in a sequence of bonding operations.

PRIOR ART

FIG. 1 shows the basic structure of a conventional transducer. A plurality of piezoelectric ceramic elements 1 are formed in a stack and held together in compression by end pieces 2. Although not shown in FIG. 1, the piezoelectric crystals are connected to control circuitry and receive input signals that cause the ceramic elements to generate ultrasonic vibrations. The ultrasonic vibrations are amplified by an elongate amplifying horn 3 at the free end of which is a bonding tool in the form of a capillary 4. It will be noted that the capillary 4 is disposed at right angles to the axis of the transducer and the direction of the vibrations. In use, the bonding tool is used to apply ultrasonic energy to the location where, for example, a lead wire is to be connected to a contact pad. A barrel 5 is provided between the ceramic elements 1 and the amplifying horn 3 to enable the transducer to be mounted to a wire bonding apparatus. The line drawn over the transducer of FIG. 1 shows schematically the amplitude of the vibrations of the transducer at locations along the axis of the transducer. It will be seen that the maximum displacement amplitude is at the free end of the amplifying horn 3 where the capillary 4 is located. It should be understood that the transducer vibrates along its axis.

A number of attempts have been made to improve on this basic design of the transducer and a number of these are shown in U.S. Pat. No. 5,699,953, U.S. Pat. No. 5,884,834, U.S. Pat. No. 5,469,011, U.S. Pat. No. 5,578,888 and U.S. Pat. No. 5,816,476.

SUMMARY OF THE INVENTION

According to the present invention there is provided a transducer for a wire bonding apparatus, comprising: a plurality of piezoelectric elements sandwiched between separate first and second bodies, means for mounting said transducer to a bonding apparatus, said mounting means located between two of said piezoelectric elements, one of said bodies being an ultrasonic amplifying means having a bonding tool provided at a distal end thereof.

Preferably an equal number of piezoelectric elements are provided on each side of the mounting means, for example from 2 to 4 elements on each side, and the piezoelectric elements may be held in compression between the bodies. For example the piezoelectric elements may comprise annular elements with screw threaded bolts that pass through the elements and threadedly engage the bodies.

In a preferred arrangement a mounting means is provided at a vibration nodal point.

It is also preferred that in use the displacement amplitude (A2) of the distal end of the amplifying horn is greater than the displacement amplitude (A1) of the distal end of the other body. In preferred arrangements the diameter Φ1 of the distal end of the other body is greater than the diameter Φ2 of the distal end of the amplifying horn. Furthermore as the ratio Φ1/Φ2 increases the ratio A2/A1 increases.

Another way to increase the ratio A2/A1 is to select the profile of the amplifying horn.

Another way to increase the ratio A2/A1 is by forming the two bodies of different materials.

Viewed from another aspect the present invention provides a method of forming a transducer for a wire bonding apparatus, comprising providing a plurality of piezoelectric elements sandwiched between separate first and second bodies, one of said bodies being an ultrasonic amplifying means having a bonding tool provided at a distal end thereof, locating means for mounting said transducer to a bonding apparatus between two of said piezoelectric elements, and controlling the ratio of the displacement amplitude (A2) of the distal end of the amplifying horn to the displacement amplitude (A1) of the distal end of the other body by selecting parameters from the group consisting of the distal end diameters of the bodies, the materials forming the bodies, and the profile of the amplifying horn and combinations thereof, so as to increase said ratio,

BRIEF DESCRIPTION OF THE DRAWINGS

Some embodiments of the invention will now be described by way of example and with reference to the accompanying drawings, in which.

DETAILED DESCRIPTION OF PREFERRED EMBODIMENTS

Figure 1:
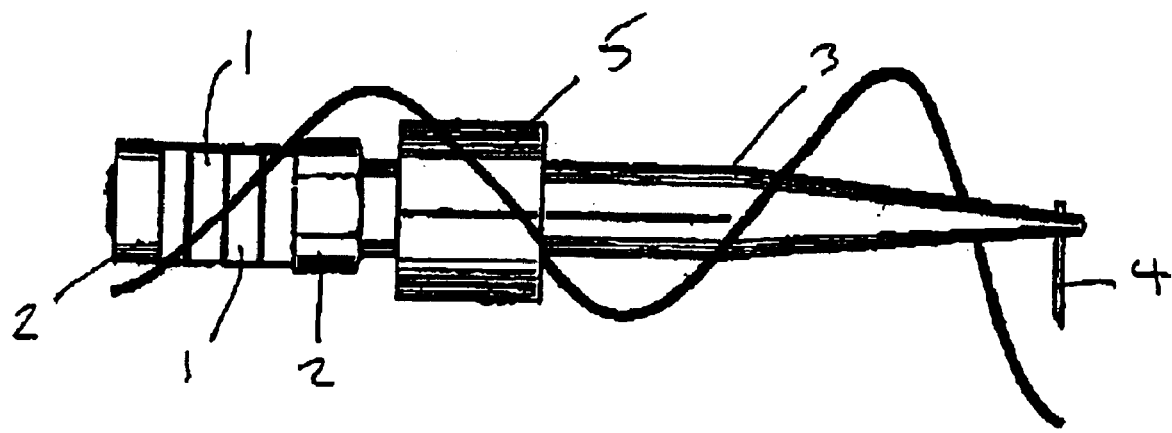
FIG. 1 is a schematic view of a transducer according to the prior art.
Figure 2:
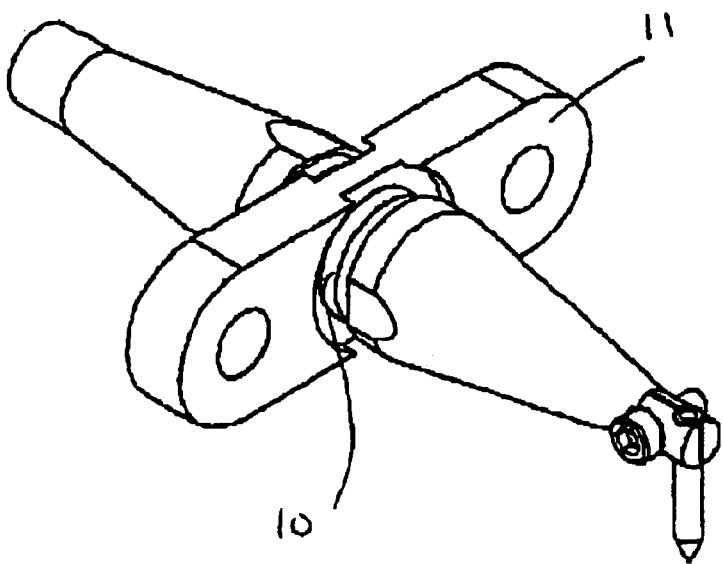
FIG. 2 is a perspective view of a first embodiment of the present invention.
Figure 3:
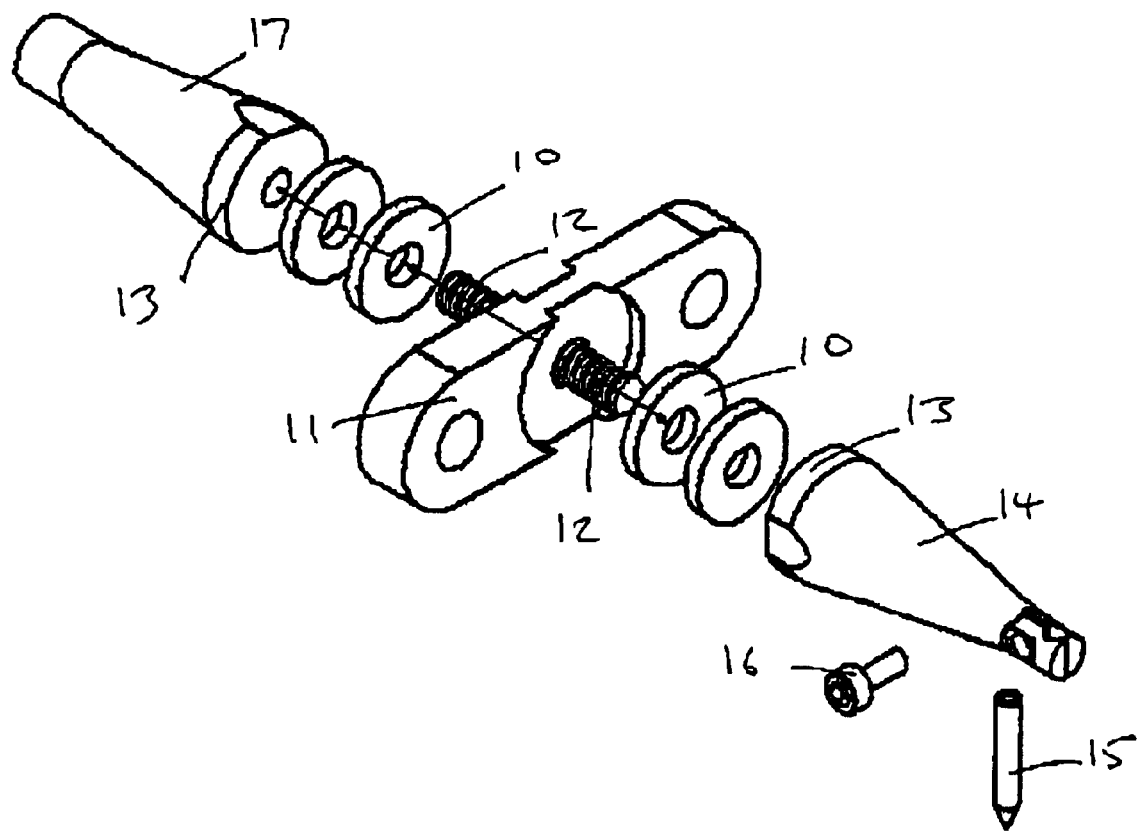
FIG. 3 is an exploded perspective view of the embodiment of FIG. 2.

Referring firstly to FIGS. 2 and 3 there is shown a first embodiment of the invention. In this embodiment a plurality of piezoelectric ceramic rings 10 are disposed in a stack. In this example four rings 10 are provided, with two rings being located on either side of a mounting flange 11. The rings 10 are formed with central apertures through which pass bolts 12 extending from the mounting flange 11. Bolts 12 engage screw-threaded end pieces 13 whereby the ceramic rings 10 may be held in a stack under compression.

The piezoelectric elements are held in compression between two separate bodies. Mounted on one side of the flange 11 (with one of the end pieces 13 attached thereto) is a first body in the form of an ultrasonic amplifying horn 14, and at the free end of the horn 14 is provided a bond tool such as a capillary 15 fixed to the end of the horn 14 by means of fixing screw 16. Mounted on the other side of the flange 11 from the bond tool 15 is the other, second, body 17. The other body 17 is also formed with one of the end pieces 13 and so it will be understood that the ceramic rings 10 are held in compression between the two bodies 14, 17.

Figure 4:
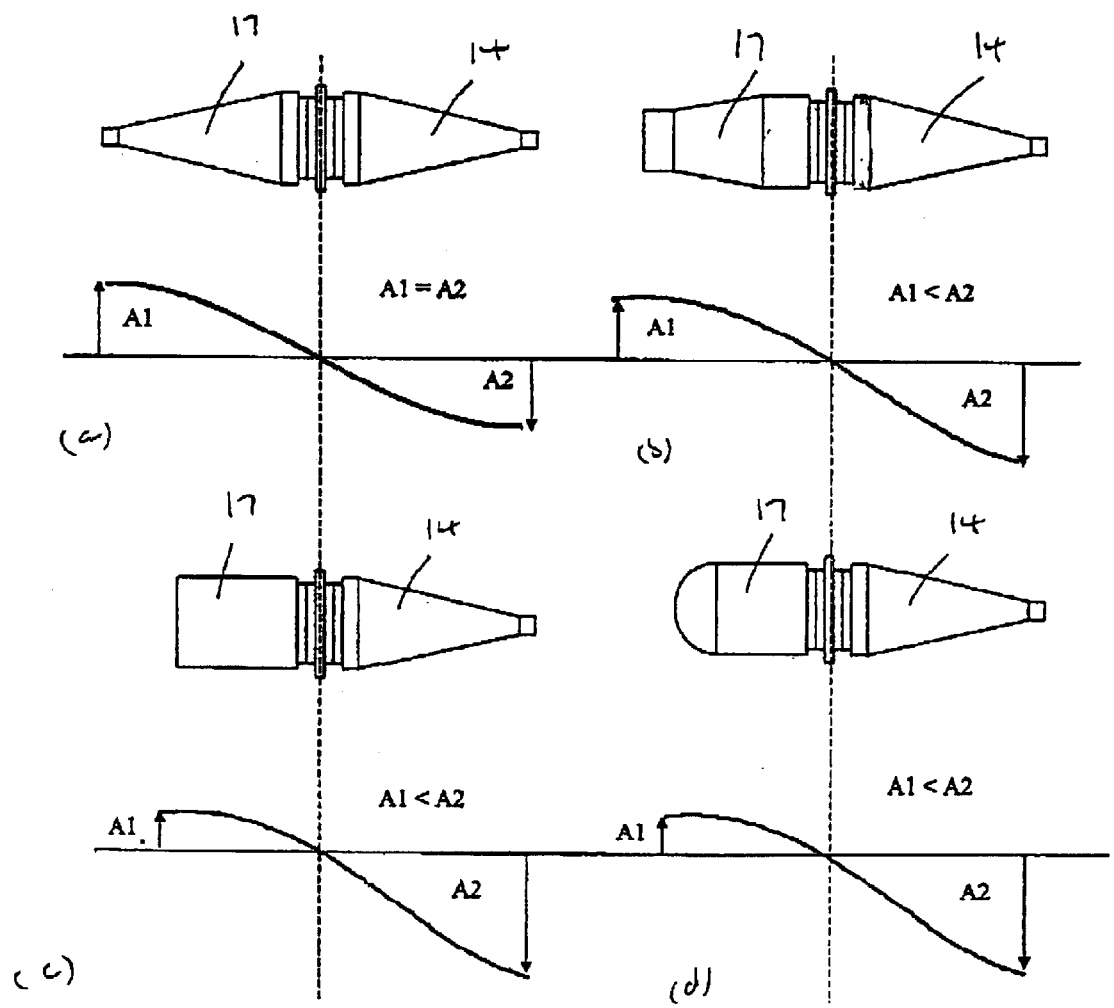
FIGS. 4(a)–(d) are side views of further embodiments of the present invention accompanied by plots showing displacement amplitude along the transducer axis.

The piezoelectric elements together with the compressing bodies 14, 17 are designed to vibrate axially at half-wavelength (fundamental mode) of the oscillation wavelength, or at odd multiples thereof. Preferably, antinodes are located at the two free or distal ends of the transducer and there is an oscillation nodal point in between. In practice, the ultrasonic transducer is operated such that the length of the transducer is substantially equivalent to ½λ, where λ is the oscillation wavelength. In other words, the length of the transducer may be equivalent to ½λ, 3×½λ, 5×½λ, etc. Nevertheless, the overall transducer length can be minimized by designing the transducer such that the distance between the distal ends is exactly ½λ, (i.e. at its fundamental mode) for a given ultrasonic frequency and combination of materials (see FIG. 4).

The two bodies are potentially, as will be discussed further below, of various possible shapes and materials. However, the shape and the material forming the bodies are chosen such that the resulting transducer has the following desired properties: (1) the flange 11 should lie on an oscillation nodal point (i.e. with no displacement), and (2) the bond tool 15 should be at a point of maximum displacement.

Furthermore by appropriately selecting the properties of the two bodies, as will be described below, the amplitude of the displacement of the distal end of the amplifying horn can be maximized. This has the effect that the energy associated with the vibration of the transducer can be concentrated at the bonding tool to enhance efficient bonding.

In the embodiment of FIGS. 2 and 3, the other body is of a frustro-conical shape that is generally similar to the amplifying horn 14, though the smaller diameter end of the body 17 is larger than the corresponding end of the amplifying horn 14. As such the vibration energy is concentrated towards the distal end of the amplifying horn 14 where the bonding tool is located. This is illustrated with reference to FIG. 4.

FIGS. 4(a)–(d) illustrate four possible examples of transducers in accordance with embodiments of the invention, and in each figure the corresponding displacement amplitude is also shown. In FIG. 4 the maximum displacement at the end of the other body 17 is labeled A1, while that at the end of the amplifying horn 14 is labeled A2.

In the simplest design, shown in FIG. 4(a) the two bodies 14, 17 are substantially identical and the transducer is symmetrical about the piezo-electric discs and the mounting flange. In this design the displacement amplitude is also symmetrical and both bodies vibrate equally. As can be seen in this example, A1=A2.

The embodiment of FIG. 4(b) is generally similar to that of FIGS. 2 and 3 with a frusto-conical body 17. The diameter Φ1 of the distal end of the body 17 is greater than the corresponding diameter Φ2 of the amplifying horn 14 at its distal end. As can be seen from the plot of displacement amplitude, in this embodiment the displacement amplitude A2 at the distal end of the amplifying horn 14 is greater than the amplitude A1 at the end of the body 17.

In the embodiment of FIG. 4(c) the ratio between Φ1 and Φ2 is increased further by making the body 17 into a cylindrical shape so that Φ1 is greater than in the embodiment of FIG. 4(b). This has the effect of still further concentrating the vibration energy at the distal end of the amplifying horn and in this embodiment A2 is greater than in the embodiment of FIG. 4(b) and the ratio A2/A1 is increased further.

The embodiment of FIG. 4(d) is similar to that of FIG. 4(c) save that in FIG. 4(d) the body 17 is formed with a domed end surface.

Figure 5:
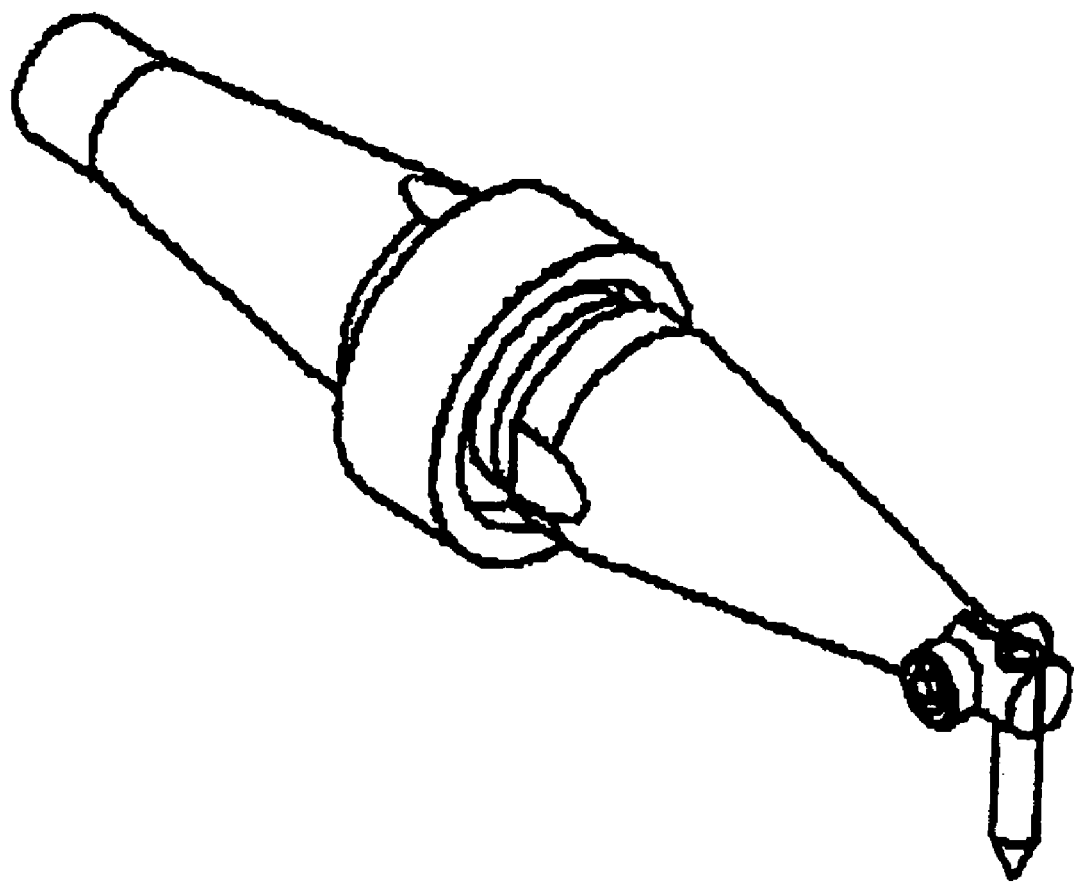
FIG. 5 is a perspective view of a second embodiment of the invention.

It should be understood that the present invention is not of course limited to flange-mounted transducers and could equally apply to other forms of transducers such as barrel-mounted transducers as shown in FIG. 5.

Figure 6:
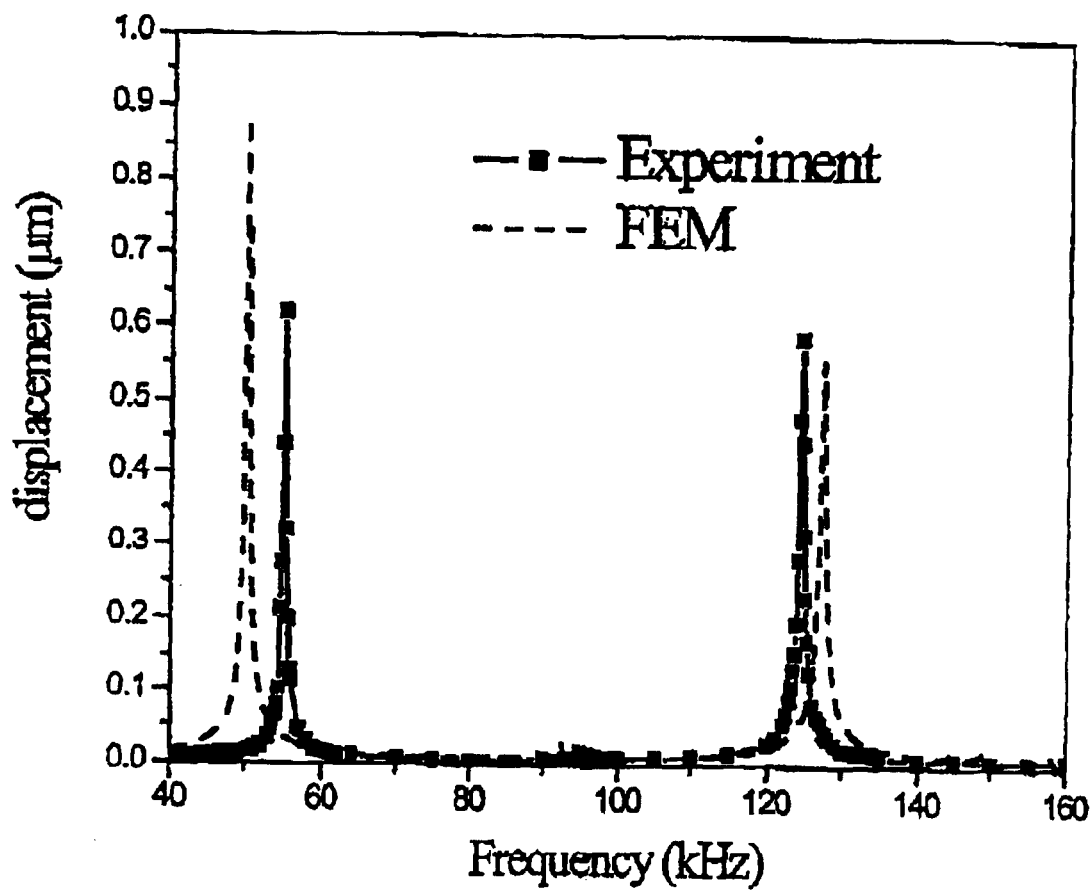
FIG. 6 is a plot of displacement amplitude against vibration frequency for an embodiment of the present invention.
Figure 7:
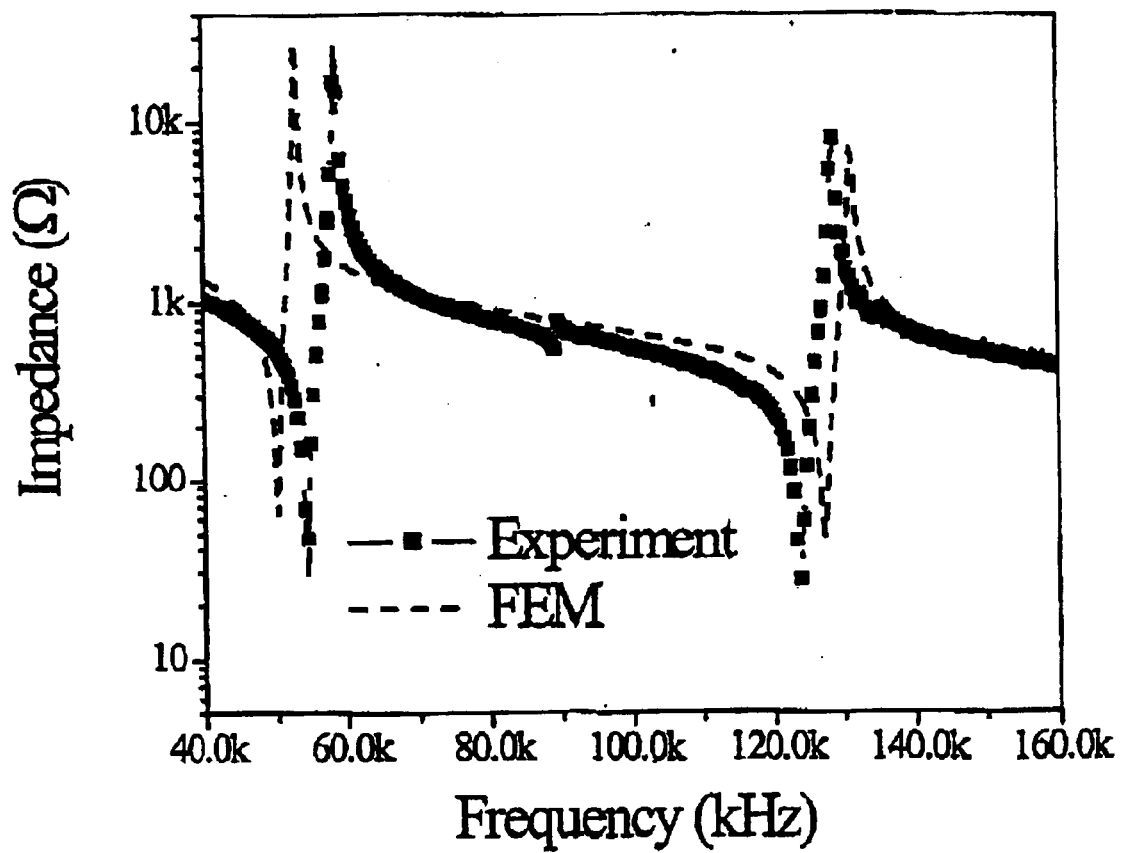
FIG. 7 is a plot of impedance against vibration frequency for an embodiment of the present invention.

FIG. 6 shows the displacement amplitude against vibration frequency for an embodiment of the invention and plots both the expected displacement obtained from finite element modeling (FEM) and also as measured in experiments. The plot shows two clearly defined resonances. FIG. 7 similarly shows the impedance of the transducer as a function of vibration frequency, again obtained both by experiment and by FEM simulation, and again this confirms the presence of two resonant frequencies, at around 50 kHz and at around 125 kHz. In the embodiment of FIGS. 6 and 7 the transducer takes the form of FIG. 2, i.e. it is flange mounted with the first body having a frusto-conical form having an end diameter of 5 mm, while the end diameter of the amplifying horn is 3 mm. The piezoelectic rings have an outer diameter of 8 mm and an inner diameter of 3 mm and a thickness of 1 mm. A total of eight rings are used, four on either side of the mounting. The two bodies and the flange mounting are all made of a titanium alloy.

An important advantage of the present invention is that by suitable design of the transducer, and in particular by selecting the parameters of the first body 17, the displacement amplitude of the distal end of the amplifying horn can be controlled, and preferably increased.

Figure 8:
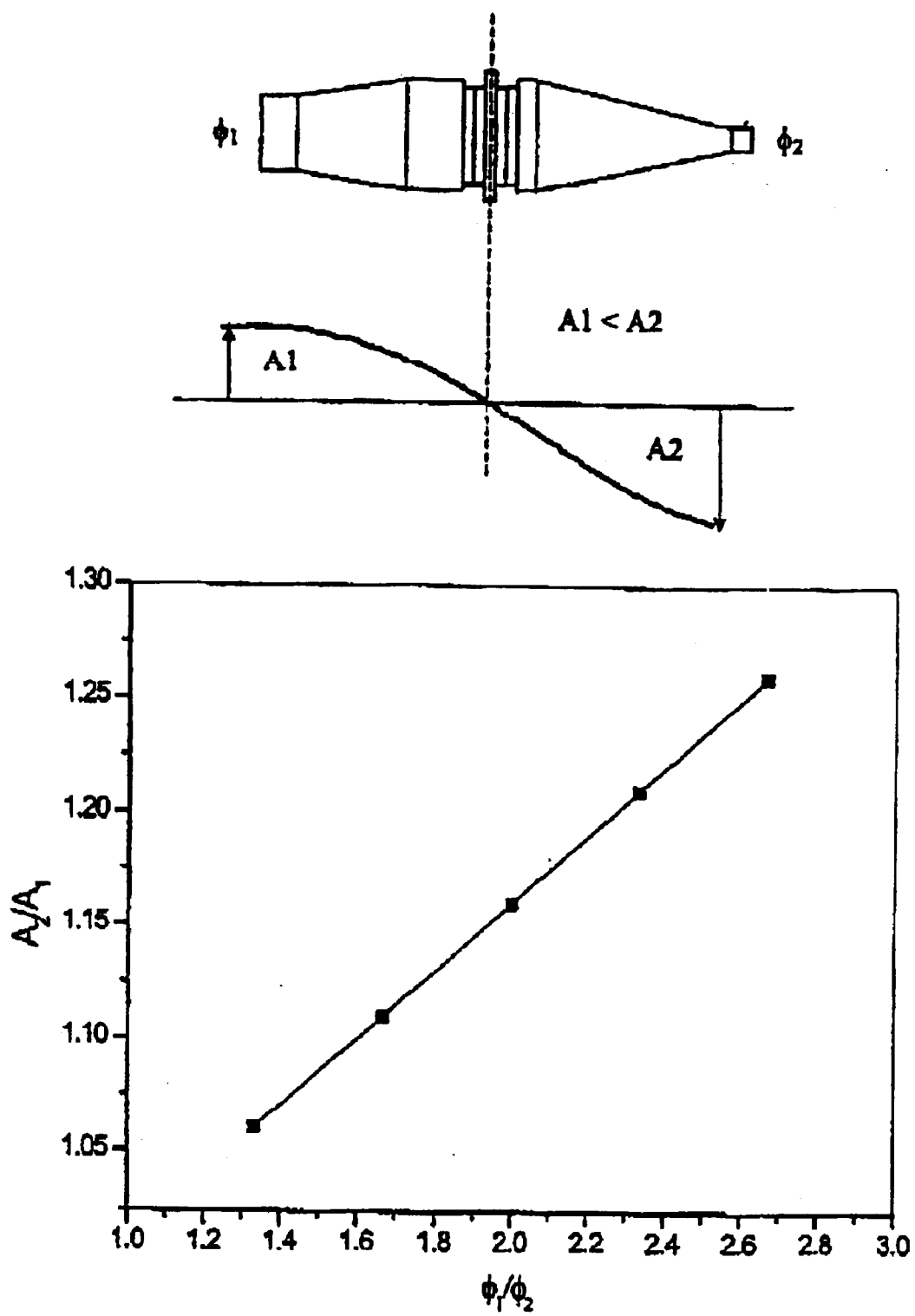
FIG. 8 illustrates the effect of varying the dimensions of the transducer on the displacement amplitude.

FIG. 8 illustrates the effect of the varying the diameter of the distal end of the first body 17 in the embodiment of FIGS. 2, 3 and FIG. 4(b). It will be seen that as the diameter Φ1 of the distal end of the first body 17 increases in proportion to Φ2, then the amplitude A2 also increases in proportion to A1. In other words A2 can be increased by reducing the size of the diameter Φ2 relative to Φ1.

Figure 9:
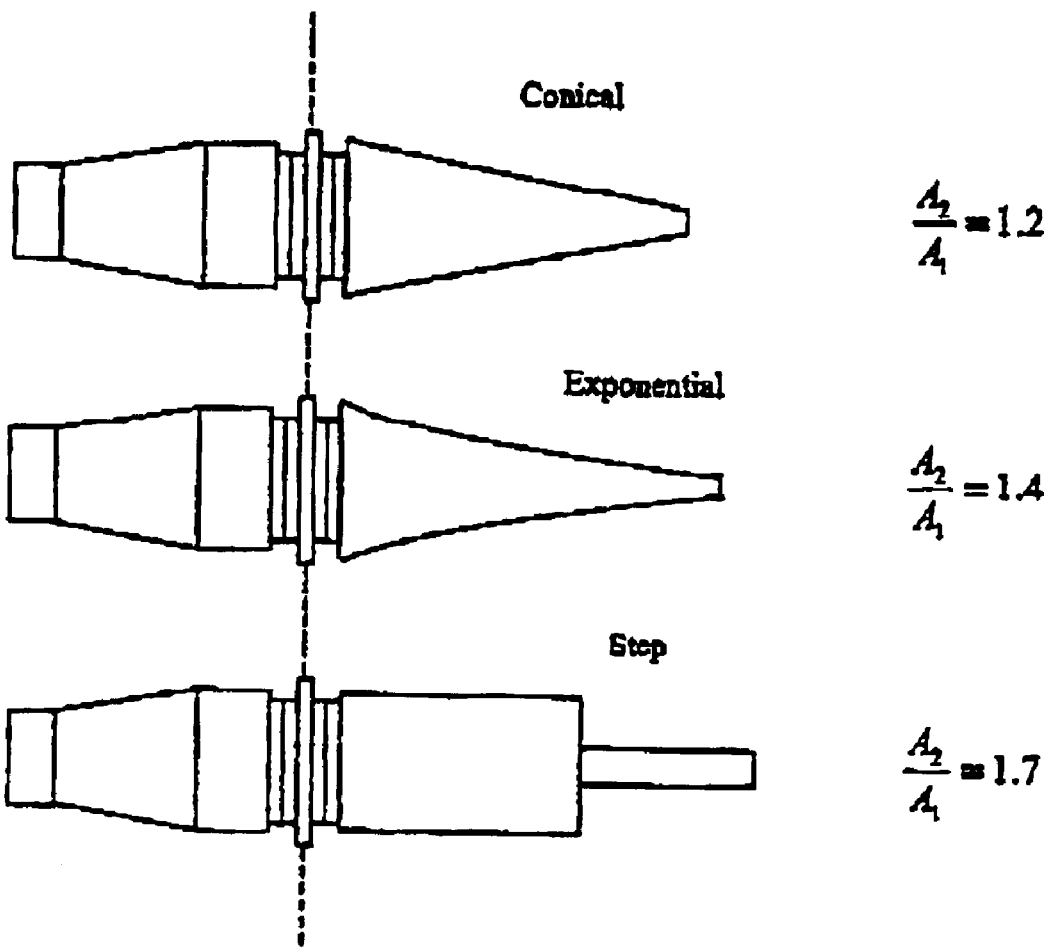
FIG. 9 illustrates the effect of varying the geometry of the transducer on the displacement amplitude.

FIG. 9 shows that even if the end diameters of the first and second bodies are kept constant, the displacement amplitude can be varied by selecting an appropriate shape for the amplifying horn. Three examples are shown in FIG. 9 and in each case the first body has a distal end diameter of 5 mm, while the amplifying body has an end diameter of 3 mm. In FIG. 9(a) the amplifying horn is conical and A2/A1=1.2. If the amplifying horn 14 is provided with a profile in the form of an exponential curve shape, shown in FIG. 9(b), that ratio increases to 1.4, and it increases still further to 1.7 if the amplifying horn is formed with a step profile as shown in FIG. 9(c).

With the same shape and end diameters as shown in FIG. 9(a), the ratio A2/A1 can also be increased by changing the material of the amplifying horn. For example, if both the first body 17 and the amplifying horn 14 are made of stainless steel (modulus 190 Gpa, density 7930 kg/m$^3$, Poisson's ratio 0.3) then A2/A1 is 1.1. If the material for the amplifying horn is changed to titanium (modulus 115 Gpa, density 4700 kg/m$^3$, Poisson's ratio 0.3) while the first body remains of stainless steel, then A2/A1 increases to 1.7. If the amplifying horn is made of aluminum (modulus 72 Gpa, density 2800 kg/m$^3$, Poisson's ratio 0.35) then A2/A1 increases further to 2.1.

What is claimed is:

1. A transducer comprising a plurality of piezoelectric elements sandwiched between separate first and second bodies, means for mounting said transducer to a bonding apparatus, said mounting means located between two said piezoelectric elements, one of said bodies being an ultrasonic amplifying means having a bonding tool provided at a distal end thereof, wherein the transducer is operated such that a length of the transducer is substantially equivalent to odd multiples of ½λ, where λ is an oscillation wavelength of the transducer.

2. A transducer as claimed in claim 1 wherein an equal number of piezoelectric elements are provided on each side of said mounting means.

3. A transducer as claimed in claim 1 wherein said piezoelectric elements are held in compression between said bodies.

4. A transducer as claimed in claim 3 wherein said piezoelectric elements comprise annular elements, and wherein screw threaded bolts pass through said elements and threadedly engage said bodies.

5. A transducer as claimed in claim 1 wherein said mounting means is provided at a vibration nodal point.

6. A transducer as claimed in claim 5 wherein in use the displacement amplitude (A2) of the distal end of said amplifying horn is greater than the displacement amplitude (A1) of the distal end of the other body.

7. A transducer as claimed in claim 6 wherein the diameter Φ1 of the distal end of the other body is greater than the diameter Φ2 of the distal end of the amplifying horn.

8. A transducer as claimed in claim 7 wherein as the ratio Φ1/Φ2 increases the ratio A2/A1 increases.

9. A transducer as claimed in claim 6 wherein the profile of the amplifying horn is selected to increase the ratio A2/A1.

10. A transducer as claimed in claim 6 wherein the ratio A2/A1 is increased by forming the two bodies of different materials.

11. A transducer as claimed in claim 1 wherein the two bodies are formed of different materials.

12. A transducer as claimed in claim 1 wherein the distal end diameter of the amplifying horn is smaller than the distal end diameter of the other body.

13. A method of forming a transducer for a wire bonding apparatus, comprising providing a plurality of piezoelectric elements sandwiched between separate first and second bodies, one of said bodies being an ultrasonic amplifying means having a bonding tool provided at a distal end thereof, locating means for mounting said transducer to a bonding apparatus between two of said piezoelectric elements, and controlling the ratio of the displacement amplitude (A2) of the distal end of the amplifying horn to the displacement amplitude (A1) of the distal end of the other body by selecting parameters from the group consisting of the distal end diameters of the bodies, the materials forming the bodies, and the profile of the amplifying horn and combinations thereof, so as to increase said ratio, wherein the transducer is operated such that a length of the transducer is substantially equivalent to odd multiplies of ½λ, where λ is an oscillation wavelength of the transducer.

14. A method as claimed in claim 13 wherein the ratio A2/A1 is increased by increasing the ratio of the diameter Φ1 of the distal end of the other body to the diameter Φ2 of the distal end of the amplifying horn.

15. A method as claimed in claim 13 wherein the ratio A2/A1 is increased by forming the amplifying horn of a material of lower density than a material used to form the other body.

16. A method as claimed in claim 13 wherein the ratio A2/A1 is increased by forming the amplifying horn with a profile in the form of an exponential curve or a step.

* * * * *